(12) United States Patent
Teranishi

(10) Patent No.: US 12,170,224 B2
(45) Date of Patent: Dec. 17, 2024

(54) METHOD OF PROCESSING WAFER

(71) Applicant: DISCO CORPORATION, Tokyo (JP)

(72) Inventor: Shunsuke Teranishi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 399 days.

(21) Appl. No.: 17/407,311

(22) Filed: Aug. 20, 2021

(65) Prior Publication Data

US 2022/0076999 A1 Mar. 10, 2022

(30) Foreign Application Priority Data

Sep. 4, 2020 (JP) .................................. 2020-149340

(51) Int. Cl.
*H01L 21/78* (2006.01)
*H01L 21/268* (2006.01)
*H01L 21/304* (2006.01)

(52) U.S. Cl.
CPC ............ *H01L 21/78* (2013.01); *H01L 21/304* (2013.01); *H01L 21/268* (2013.01); *H01L 21/3043* (2013.01)

(58) Field of Classification Search
CPC ................. H01L 21/461; H01L 21/463; H01L 21/67092; H01L 21/6715; H01L 21/7813; B23K 26/38
See application file for complete search history.

(56) References Cited

U.S. PATENT DOCUMENTS 6,472,295 B1 * 10/2002 Morris .................... B23K 26/38
438/33
10,155,323 B2 * 12/2018 Hirata ............... H01L 21/02002
11,201,126 B2 * 12/2021 Priewasser .............. H01L 24/04
2011/0256689 A1 * 10/2011 Sekiya ............. B29D 11/00432
219/121.68
2018/0108565 A1 * 4/2018 Sekiya .............. H01L 21/76894
(Continued)

FOREIGN PATENT DOCUMENTS

DE 10 2016 214 985 A1 2/2017
JP 2008218599 A 9/2008
JP 2020-009827 A 1/2020

OTHER PUBLICATIONS

Office Action issue by the German patent office for corresponding application No. 10 2021 209 439.0, dated Apr. 5, 2024.

*Primary Examiner* — Walter H Swanson
*Assistant Examiner* — Moataz Khalifa
(74) *Attorney, Agent, or Firm* — GREER BURNS & CRAIN, LTD.

(57) ABSTRACT

A method of processing a wafer includes a groove forming step of forming grooves in the wafer to a depth equal to or larger than a thickness of chips to be produced from the wafer from a face side of the wafer along projected dicing lines, a separation initiating point forming step of positioning a focused spot of a laser at a depth in the wafer corresponding to a thickness of the chips from a reverse side of the wafer, applying the laser beam to the wafer while moving the focused spot and the wafer relatively to each other, thereby forming separation initiating points in the wafer that are parallel to the face side of the wafer and made up of modified layers and cracks, and a chip peeling step of peeling off the chips from the wafer at the separation initiating points.

20 Claims, 17 Drawing Sheets

(56) References Cited

U.S. PATENT DOCUMENTS

2018/0374738 A1* 12/2018 Lee .................. H01L 21/67288
2020/0075415 A1* 3/2020 Sekiya .................... H01L 21/78
2022/0059370 A1* 2/2022 Landru ............. H01L 21/67092

* cited by examiner

METHOD OF PROCESSING WAFER

BACKGROUND OF THE INVENTION

Field of the Invention

The present invention relates to a method of processing a wafer to produce chips therefrom.

Description of the Related Art

There have been known methods of producing chips from wafers by grinding and cutting the wafers (see, for example, JP 2008-218599A).

SUMMARY OF THE INVENTION

A need has arisen in the art for a new method of producing chips of a desired thickness from wafers.

It is therefore an object of the present invention to provide a method of processing a wafer to produce chips of a desired thickness therefrom.

In accordance with an aspect of the present invention, there is provided a method of processing a wafer to produce chips therefrom, the wafer having on a face side thereof a plurality of projected dicing lines classified into two groups extending respectively in first directions and second directions transverse to the first directions and a plurality of chip areas demarcated by the projected dicing lines. The method includes a groove forming step of forming grooves in the wafer to a depth equal to or larger than a desired thickness of the chips from the face side of the wafer along the projected dicing lines, a separation initiating point forming step of positioning a focused spot of a laser beam having a wavelength transmittable through the wafer, at a depth in the wafer corresponding to a thickness of the chips from a reverse side of the wafer that is opposite the face side thereof, applying the laser beam to the wafer while moving the focused spot and the wafer relatively to each other, thereby forming separation initiating points in the wafer that are parallel to the face side of the wafer and made up of modified layers and cracks extending from the modified layers in the wafer, and a chip peeling step of peeling off the chips from the wafer at the separation initiating points.

Preferably, the separation initiating point forming step includes applying the laser beam to the wafer while positioning the focused spot thereof at depths depending on at least two different thicknesses of chips respectively in the chip areas, the groove forming step includes forming grooves in the wafer to a depth equal to or larger than the desired thickness of the chips respectively in the chip areas, and the chip peeling step includes forming chips having at least two different thicknesses respectively in the chip areas.

Preferably, devices are formed respectively in the chip areas, and the groove forming step, the separation initiating point forming step, and the chip peeling step are carried out in any one of the chip areas in which the device is determined as defective.

According to the present invention, there is provided a new method of processing a wafer to produce chips having a desired thickness therefrom.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of the present invention will be described in detail hereinbelow with reference to the accompanying drawings. The present invention is not limited to the details of the embodiments described below. The components described below cover those which could easily be anticipated by those skilled in the art and those which are essentially identical to those described above. Further, the arrangements described below can be combined in appropriate manners. Various omissions, replacements, or changes of the arrangements may be made without departing from the scope of the present invention. In the description to be described below, those components that are identical to each other are denoted by identical reference symbols, and will be omitted from description.

First Embodiment

Figure 1:
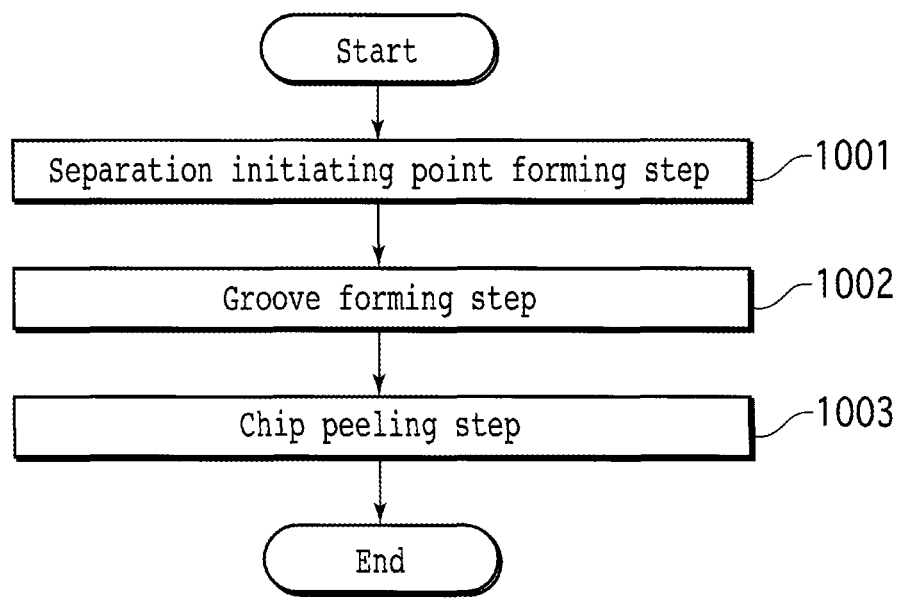
FIG. 1 is a flowchart of an example of a processing sequence of a method of processing a wafer according to a first embodiment of the present invention.

A method of processing a wafer according to a first embodiment of the present invention will be described below with reference to the drawings. As illustrated in FIG. 1, the method of processing a wafer according to the first embodiment includes a separation initiating point forming step 1001, a groove forming step 1002, and a chip peeling step 1003.

Figure 2:
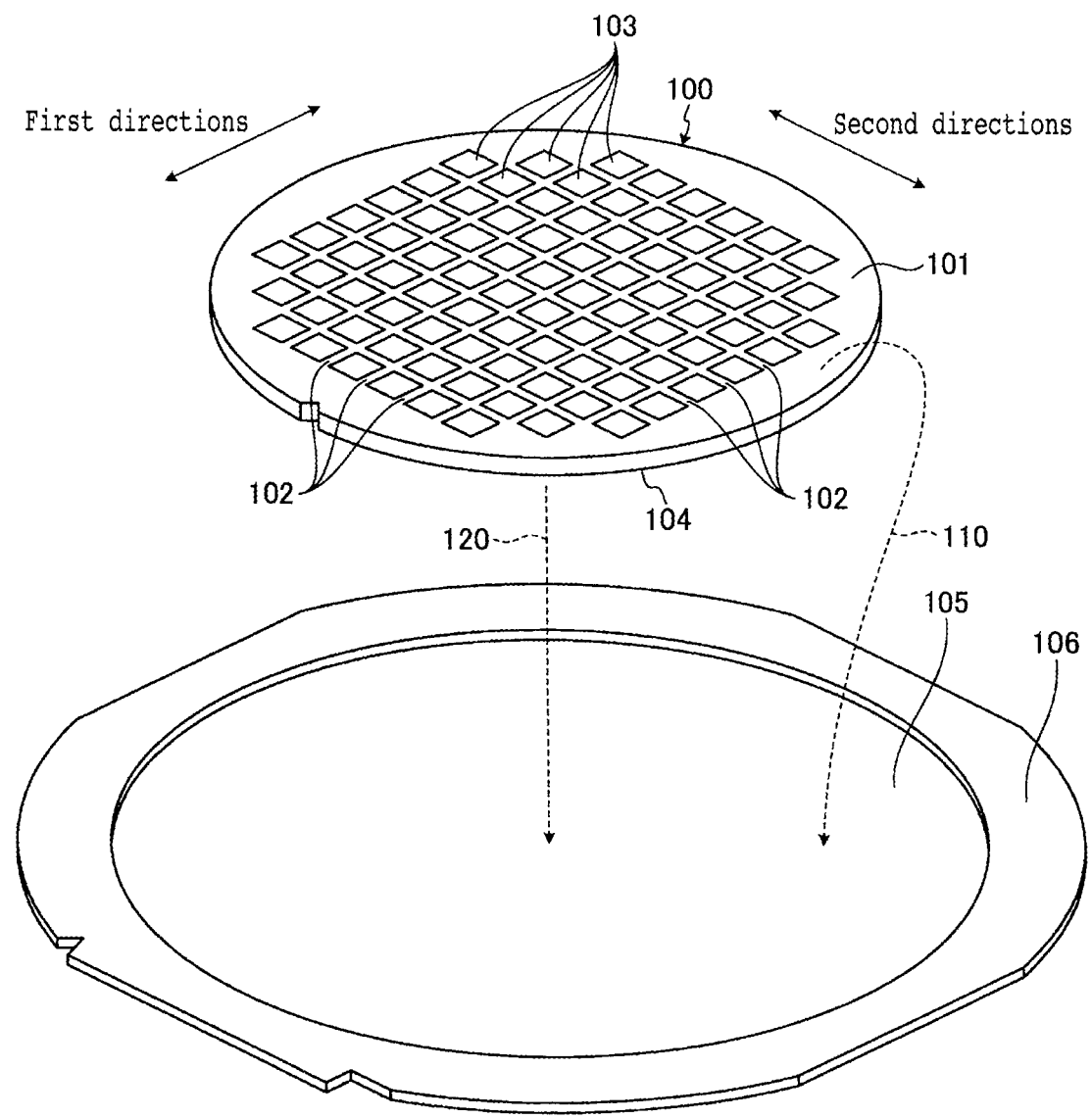
FIG. 2 is a perspective view of an example of a wafer to be processed by the method illustrated in FIG. 1.

A wafer 100 (see FIG. 2) to be processed by the method according to the first embodiment includes a semiconductor wafer, an optical device wafer, or the like shaped as a circular plate made of a base material such as silicon, sapphire, silicon carbide (SiC), or gallium arsenide, for example. As illustrated in FIG. 2, the wafer 100 has on a flat face side 101 thereof a plurality of projected dicing lines 102 classified into two groups extending respectively in first directions and second directions transverse to the first directions and a plurality of chip areas 103 demarcated by the projected dicing lines 102. According to the first embodiment, the wafer 100 further includes a plurality of chips 160, i.e., devices (see FIG. 8), formed respectively in the chip areas 103. According to the first embodiment, the first directions and the second directions extend perpendicularly to each other, so that the projected dicing lines 102 are illustrated as extending in a grid pattern. However, the present invention is not limited to such details.

According to the first embodiment, in each of the steps of the method, an adhesive tape 105 is affixed to the face side 101 or a reverse side 104 of the wafer 100 that is opposite the face side 101, as indicated by an arrow 110 or an arrow 120, and an annular frame 106 is mounted on an outer peripheral edge portion of the adhesive tape 105. The wafer 100 as thus assembled with the adhesive tape 105 and the annular frame 106 is processed each of the steps of the method. However, the present invention is not limited to such details.

Figure 3:
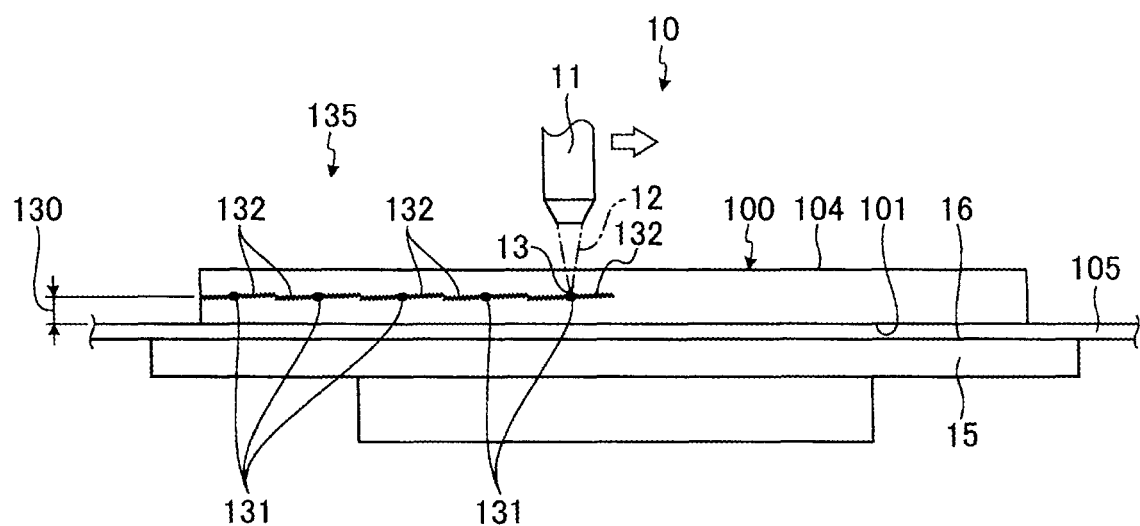
FIG. 3 is a cross-sectional view illustrating a separation initiating point forming step of the method illustrated in FIG. 1.
Figure 4:
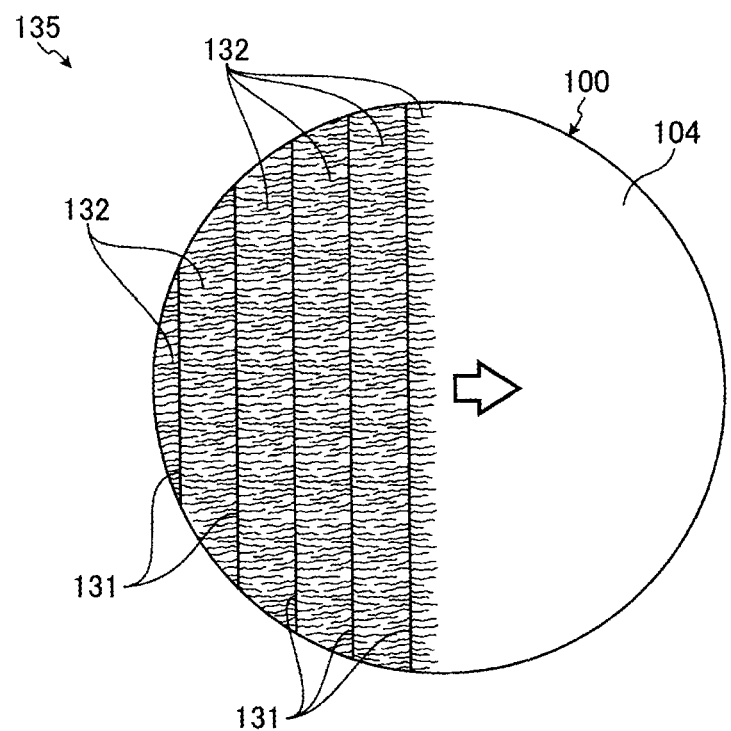
FIG. 4 is a plan view illustrating the separation initiating point forming step of the method illustrated in FIG. 1.

The separation initiating point forming step 1001 is a step in which, as illustrated in FIG. 3, a focused spot 13 of a laser beam 12 having a wavelength transmittable through the wafer 100 is positioned in the wafer 100 at a depth, commensurate with a thickness 130 of chips 160 (see FIG. 8) to be produced from the wafer 100, from the face side 101, and the laser beam 12 is applied to the wafer 100 from the reverse side 104 thereof while the focused spot 13 and the wafer 100 are being moved relatively to each other, forming modified layers 131 and cracks 132 extending from the modified layers 131 at the depth in the wafer 100, to thereby form separation initiating points 135 parallel to the face side 101, as illustrated in FIGS. 3 and 4.

In the separation initiating point forming step 1001, first, the adhesive tape 105 is affixed to the face side 101 of the wafer 100. In the separation initiating point forming step 1001, then, as illustrated in FIG. 3, a holding table 15 of a laser processing apparatus 10 holds on a holding surface 16 thereof the face side 101 of the wafer 100 with the adhesive tape 105 interposed therebetween. According to the first embodiment, the holding table 15 includes a disk-shaped frame with a recess defined in a surface thereof and a disk-shaped attracting member fitted in the recess in the frame, the disk-shaped attracting member being made of porous ceramic having a number of pores therein. The disk-shaped attracting member has an upper surface that acts as the holding surface 16 for holding the wafer 100 under suction thereon with a negative pressure introduced from a suction source, not illustrated, connected to the attracting member.

In the separation initiating point forming step 1001, then, as illustrated in FIG. 3, the focused spot 13 of the laser beam 12 that is emitted from a laser oscillator 11 of the laser processing apparatus 10 is vertically positioned in the wafer 100 at a position higher than the face side 101 thereof by a distance equal to the thickness 130 of chips 160 (see FIG. 8) to be produced from the wafer 100, by a vertically moving unit, not illustrated, that vertically moves the laser oscillator 11 or the holding table 15 and a beam condensing unit, not illustrated, disposed in the laser oscillator 11 for vertically moving the focused spot 13 of the laser beam 12. According to the first embodiment in which the laser beam 12 is applied to the wafer 100 from the reverse side 104 thereof, the position higher than the face side 101 of the wafer 100 by the distance equal to the thickness 130 of chips 160 corresponds to the depth commensurate with the thickness 130 of chips 160.

Figure 8:
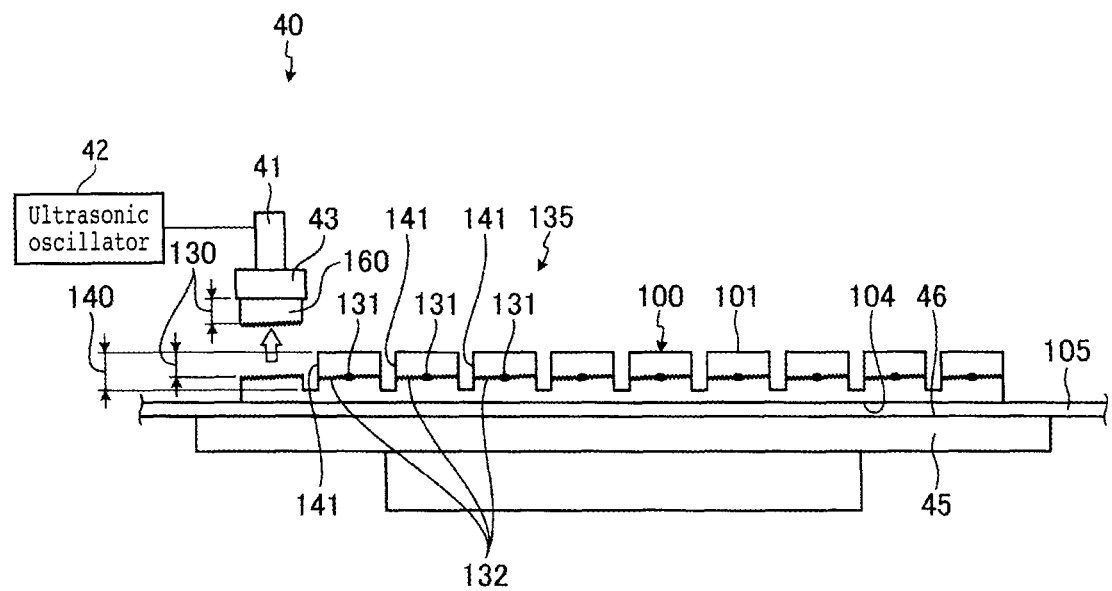
FIG. 8 is a cross-sectional view illustrating a chip peeling step of the method illustrated in FIG. 1.

In the separation initiating point forming step 1001, thereafter, as illustrated in FIG. 3, while the focused spot 13 and the wafer 100 are being moved relatively to each other along predetermined directions parallel to the face side 101, i.e., upward and downward directions on the sheet of FIG. 4, by a moving unit, not illustrated, that moves the laser oscillator 11 or the holding table 15 along the directions parallel to the face side 101, the laser beam 12 is continuously vertically applied to the wafer 100 from the reverse side 104 thereof, forming modified layers 131 linearly along the predetermined directions in the wafer 100 at the position higher than the face side 101 thereof by the distance equal to the thickness 130 of chips 160 (see FIG. 8). In the separation initiating point forming step 1001, the laser beam 12 emitted from the laser oscillator 11 and applied to the wafer 100 is a pulsed laser beam, for example.

The modified layers 131 formed in the separation initiating point forming step 1001 include layers in which the base material of the wafer 100 is made amorphous at the focused spot 13 of the laser beam 12, with residual stresses acting in directions parallel to the face side 101. In the separation initiating point forming step 1001, as illustrated in FIGS. 3 and 4, the residual stresses form cracks 132 extending from the modified layers 131 in directions transverse to the predetermined directions. The modified layers 131 and the cracks 132 that are formed in the separation initiating point forming step 1001 become separation initiating points 135 in a peeling process that is carried out in the chip peeling step 1003 to be described later.

Figure 6:
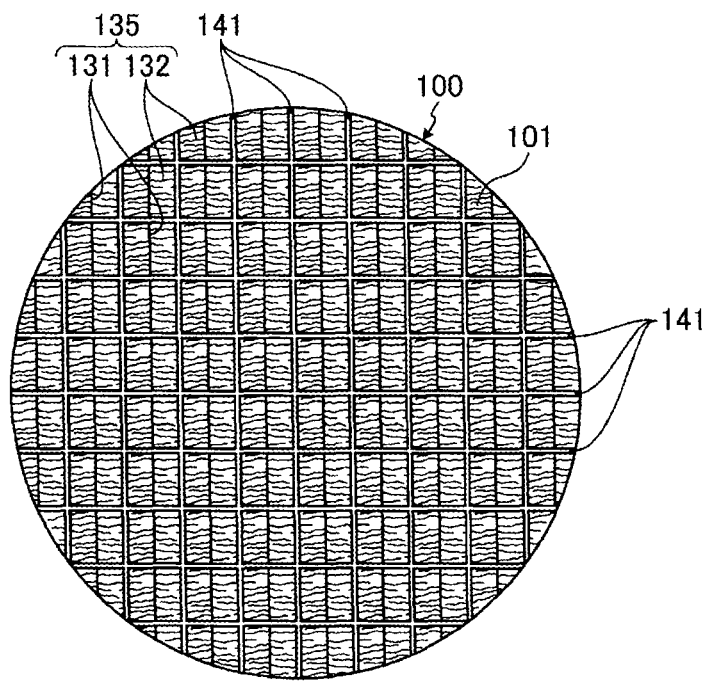
FIG. 6 is a plan view illustrating the first example of the groove forming step of the method illustrated in FIG. 1.

In the separation initiating point forming step 1001, as illustrated in FIG. 4, the linear modified layers 131 are formed parallel to each other at spaced intervals depending on the effective extension length of the cracks 132 from the modified layers 131, i.e., at spaced intervals approximately twice (in a range of 1.9 to 2.1 times) the effective extension length of the cracks 132 from the modified layers 131 according to the first embodiment, thereby developing the separation initiating points 135 parallel to the face side 101 sufficiently uniformly without being spaced at larger intervals and localized. According to the present embodiment, the modified layers 131 are formed at spaced intervals of approximately 10 μm and the effective extension length of the cracks 132 from the modified layers 131 is approximately 5 μm. The effective extension length of the cracks 132 from the modified layers 131 represents the length of the cracks 132 that function effectively enough as the separation initiating points 135. In the separation initiating point forming step 1001, according to the first embodiment, the laser beam 12 is applied to the wafer 100 in its entirety progressively in the direction indicated by the arrow in FIGS. 3 and 4, thereby forming the modified layers 131 and the cracks 132 in the wafer 100. However, the present invention is not limited to such details. Rather, modified layers 131 and cracks 132 may be formed on in regions of the wafer 100 that correspond to the chip areas 103. In the separation initiating point forming step 1001, actually, more modified layers 131 are formed in the wafer 100. In FIGS. 4 and 6, only some of the actually formed modified layers 131 are illustrated for illustrative purposes.

The groove forming step 1002 is a step in which grooves are formed in the wafer 100 along the projected dicing lines 102 to a depth equal to or larger than the thickness 130 of chips 160 (see FIG. 8) to be produced from the wafer 100, from the face side 101. In the groove forming step 1002, the grooves that are formed are partly cut grooves whose depth is equal to or smaller than the thickness of the wafer 100.

Figure 5:
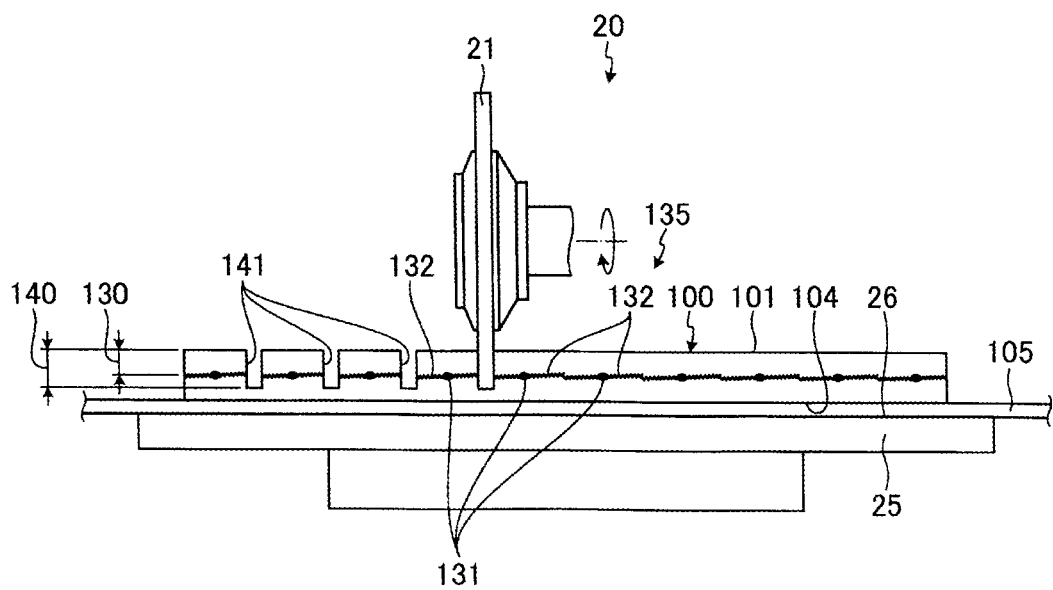
FIG. 5 is a cross-sectional view illustrating a first example of a groove forming step of the method illustrated in FIG. 1.
Figure 7:
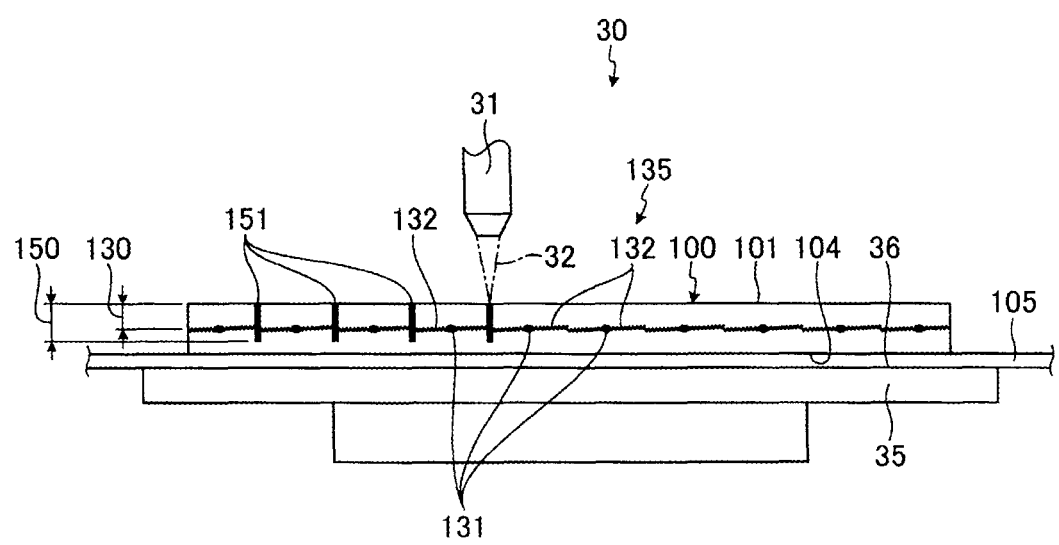
FIG. 7 is a cross-sectional view illustrating a second example of the groove forming step of the method illustrated in FIG. 1.

In the groove forming step 1002, the adhesive tape 105 affixed to the face side 101 of the wafer 100 after it has been processed in the separation initiating point forming step 1001 is peeled off, and then affixed to the reverse side 104 of the wafer 100. Next, according to a first example of the groove forming step 1002, as illustrated in FIG. 5, a holding table 25 of a cutting apparatus 20 holds on a holding surface 26 thereof the reverse side 104 of the wafer 100 with the adhesive tape 105 interposed therebetween. Alternatively, according to a second example of the groove forming step 1002, as illustrated in FIG. 7, a holding table 35 of a laser processing apparatus 30 holds on a holding surface 36 thereof the reverse side 104 of the wafer 100 with the adhesive tape 105 interposed therebetween. Each of the holding tables 25 and 35 is of the same structure as the holding table 15.

Thereafter, according to the first example of the groove forming step 1002, as illustrated in FIG. 5, a cutting blade 21 of the cutting apparatus 20 as it is rotating cuts into the wafer 100 from the face side 101 to a depth 140 equal to or larger than the thickness 130, and the cutting blade 21 or the holding table 25 is moved in a direction parallel to the face side 101 by a moving unit, not illustrated, thereby moving the cutting blade 21 and the wafer 100 relatively to each other along one of the projected dicing lines 102 to cut the wafer 100 and form a cut groove 141 in the wafer 100 to the depth 140 along the projected dicing line 102. According to the first example of the groove forming step 1002, the wafer 100 is cut along each of the projected dicing lines 102 until cut grooves 141 are formed to the depth 140 in the wafer 100 along all the projected dicing lines 102, as illustrated in FIG. 6. Actually, the modified layers 131 formed in the separation initiating point forming step 1001 exist more densely than the cut grooves 141 formed according to the first example of the groove forming step 1002.

According to the second example of the groove forming step 1002, as illustrated in FIG. 7, while a laser beam 32 having a wavelength absorbable by the wafer 100 is being emitted from a laser oscillator 31 of the laser processing apparatus 30 and applied to the wafer 100, the laser oscillator 31 or the holding table 35 is moved in a direction parallel to the face side 101 by a moving unit, not illustrated, thereby moving the laser beam 32 and the wafer 100 relatively to each other along one of the projected dicing lines 102 to perform an ablation process in which the wafer 100 is sublimed or evaporated by the laser beam 32, to thereby form a laser-processed groove 151 in the wafer 100 to a depth 150 equal to or larger than the thickness 130 along the projected dicing line 102. According to the second example of the groove forming step 1002, the laser beam 32 emitted from the laser oscillator 31 and applied to the wafer 100 is a pulsed laser beam, for example. According to the second example of the groove forming step 1002, the laser-processed grooves 151 are formed to the depth 150 in the wafer 100 along all the projected dicing lines 102, as with the first example of the groove forming step 1002.

The chip peeling step 1003 is a step in which, as illustrated in FIG. 8, chips 160 are peeled off from the wafer 100 at the separation initiating points 135 formed in the separation initiating point forming step 1001. The example in FIG. 8 illustrates the chip peeling step 1003 carried out after the first example of the groove forming step 1002. However, the chip peeling step 1003 may similarly be carried out after the second example of the groove forming step 1002.

In the chip peeling step 1003, first, as illustrated in FIG. 8, a holding table 45 of a chip peeling apparatus 40 holds on a holding surface 46 thereof the reverse side 104 of the wafer 100 with the adhesive tape 105 interposed therebetween. The holding table 45 is of the same structure as the holding table 15.

In the chip peeling step 1003, next, an attracting suction member 43 mounted on the lower end of an ultrasonic horn 41 of the chip peeling apparatus 40 is brought into contact with the face side 101 of one of the chip areas 103 of the wafer 100, and then an ultrasonic oscillator 42 applies ultrasonic waves to the ultrasonic horn 41 to cause the ultrasonic horn 41 to vibrate ultrasonically. The ultrasonically vibrating ultrasonic horn 41 then applies ultrasonic vibrations to the chip area 103 of the wafer 100, breaking the separation initiating points 135 in the chip area 103 to peel off the chip 160 on the chip area 103 from the wafer 100.

In the chip peeling step 1003, the attracting suction member 43 holds the chip 160 peeled off from the wafer 100 under suction from above and picks up the chip 160, thereby separating the chip 160 as an individual chip. According to the first embodiment, the attracting suction member 43 is connected to a suction source, not illustrated, that applies a negative pressure to a lower surface of the attracting suction member 43 to hold the chip 160 under suction from above. According to the first embodiment, in the chip peeling step 1003, the chip 160 is peeled off and picked up per chip area 103, so that all the chips 160 on the wafer 100 are separated as individual chips. If the chips 160 can be peeled off only by being held under suction by the attracting suction member 43, then the chip peeling step 1003 may be performed by a chip peeling apparatus 40 that has no ultrasonic oscillator 42.

The method of processing a wafer according to the first embodiment, arranged as described above, resides in that in the separation initiating point forming step 1001, the focused spot 13 of the laser beam 12 whose wavelength is transmittable through the wafer 100 is positioned at a depth corresponding to the thickness 130 of the chips 160 along the bottom surfaces of the chips 160 and the laser beam 12 is applied to the wafer 100 to form separation initiating points 135 in the wafer 100, then in the groove forming step 1002, a groove, i.e., a cut groove 141 in the first example or a laser-processed groove 151 in the second example, is formed in the wafer 100 along one of the projected dicing lines 102, and in the chip peeling step 1003, a chip 160 is peeled off from the wafer 100 at the separation initiating points 135. Therefore, the method of processing a wafer according to the first embodiment is advantageous in that chips 160 having a desired thickness 130 can be produced from the wafer 100 by changing the height at which the focused spot 13 of the laser beam 12 whose wavelength is transmittable through the wafer 100 is positioned. Further, the method of processing a wafer according to the first embodiment allows chips 160 to be peeled off well efficiently from the wafer 100 because a separation layer is formed on the entire bottom surfaces of the chips 160 in planar directions parallel to the face side 101, the separation layer including the separation initiating points 135 made up of the modified layers 131 and the cracks 132 extending from the modified layers 131.

Further, the method of processing a wafer according to the first embodiment resides in that in the separation initiating point forming step 1001, the laser beam 12 whose wavelength is transmittable through the wafer 100 is applied to the wafer 100 from the reverse side 104 thereof that is opposite the face side 101 on which the chips 160 are formed, thereby forming separation initiating points 135 in the wafer 100. Consequently, the laser beam 12 applied to the wafer 100 can form separation initiating points 135 well in the wafer 100 without being obstructed by the chips 160, i.e., devices, on the face side 101. In addition, the chips 160, i.e., devices, on the face side 101 are less susceptible to damage as the laser beam 12 is applied to the wafer 100 from the reverse side 104 thereof to form separation initiating points 135 in the wafer 100.

The method of processing a wafer according to the first embodiment is able to form chips 160 having a desired thicknesses without using a grinding apparatus. In addition, in a case where the groove forming step 1002 is performed by the laser processing apparatus 30, chips 160 having a desired thicknesses can be formed by only the laser processing apparatus 10 or 30. Providing one common laser processing apparatus is used as the laser processing apparatus 10 or 30, the installation space required by the laser processing apparatus is reduced, and the cost incurred to produce chips 160 from the wafer 100 is lowered. Heretofore, another step is required to lower the adhesive power of the adhesive tape affixed to the wafer when the chips are peeled off from the wafer. With the method of processing a wafer according to the first embodiment, however, since the chips 160 are peeled off from the wafer 100 at the separation initiating points 135, no step is required to lower the adhesive power of the adhesive tape affixed to the wafer. Further, with the method of processing a wafer according to the first embodiment, after the laser beam 12 has been applied to the wafer 100 from the reverse side 104 thereof in the separation initiating point forming step 1001, the groove forming step 1002 and the chip peeling step 1003 are performed successively on the wafer 100 from the face side 101 thereof. Therefore, whereas the adhesive tape 105 needs to be re-affixed twice according to a first modification to be described below, the adhesive tape 105 is re-affixed only once after the separation initiating point forming step 1001 according to the first embodiment, resulting in a reduction in man-hours.

Figure 9:
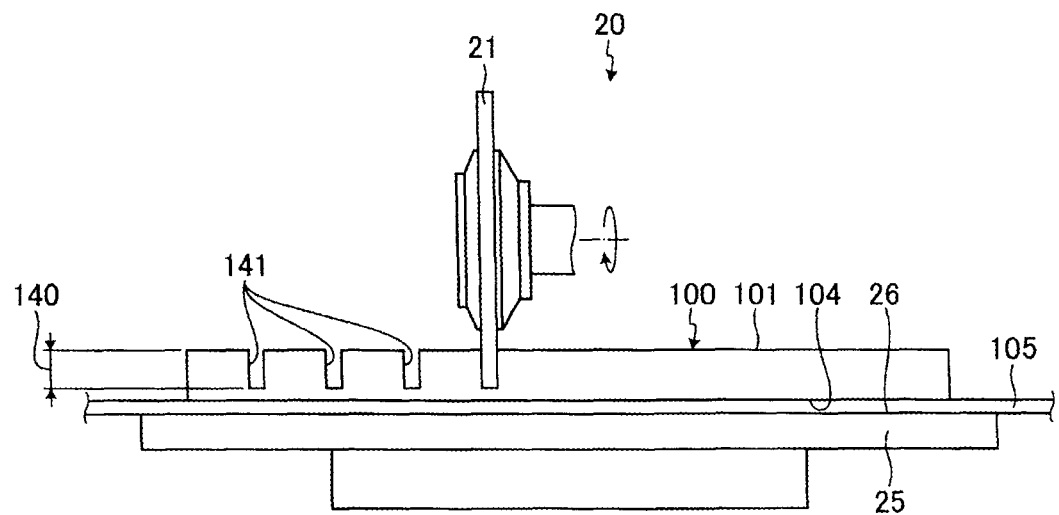
FIG. 9 is a cross-sectional view illustrating a first example of a groove forming step of a method of processing a wafer according to a first modification.
Figure 10:
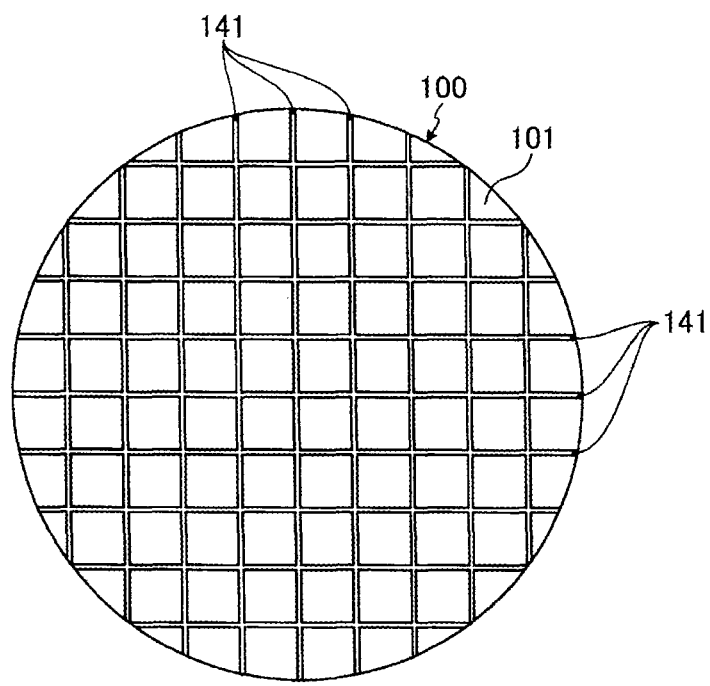
FIG. 10 is a plan view illustrating the first example of the groove forming step of the method of processing a wafer according to the first modification.
Figure 11:
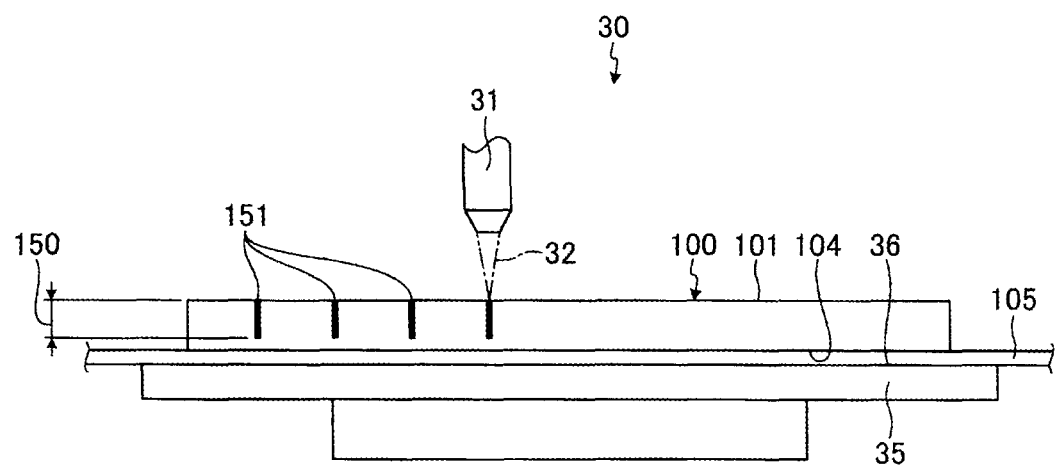
FIG. 11 is a cross-sectional view illustrating a second example of the groove forming step of the method of processing a wafer according to the first modification.
Figure 12:
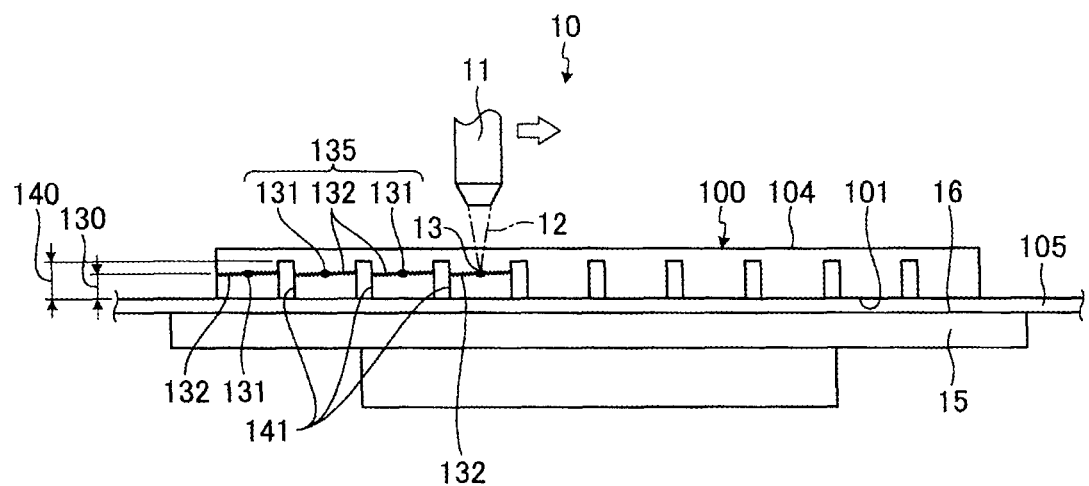
FIG. 12 is a cross-sectional view illustrating a separation initiating point forming step of the method of processing a wafer according to the first modification.
Figure 13:
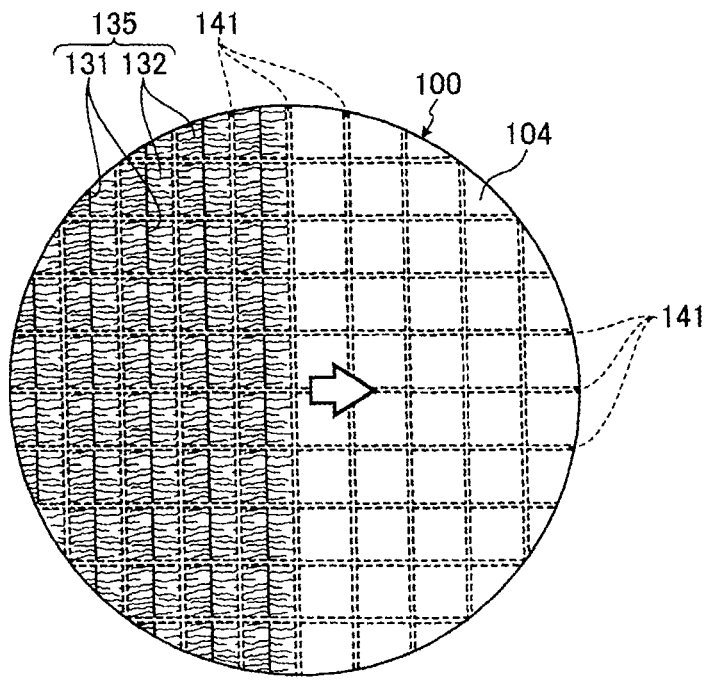
FIG. 13 is a plan view illustrating the separation initiating point forming step of the method of processing a wafer according to the first modification.

First Modification:

A method of processing a wafer according to a first modification of the present invention will be described below with reference to the drawings. FIG. 9 illustrates in cross section a first example of a groove forming step 1002 of the method of processing a wafer according to the first modification. FIG. 10 illustrates in plan the first example of the groove forming step 1002 of the method of processing a wafer according to the first modification. Specifically, FIG. 10 illustrates the face side 101 of the wafer 100 processed in the first example of the groove forming step 1002. FIG. 11 illustrates in cross section a second example of the groove forming step 1002 of the method of processing a wafer according to the first modification. FIG. 12 illustrates in cross section a separation initiating point forming step 1001 of the method of processing a wafer according to the first modification. FIG. 13 illustrates in plan the separation initiating point forming step 1001 of the method of processing a wafer according to the first modification. Specifically, FIG. 13 illustrates the reverse side 104 of the wafer 100 processed in the separation initiating point forming step 1001. Those components illustrated in in FIGS. 9 through 13 that are identical to those according to the first embodiment are denoted by identical reference symbols, and will be omitted from description.

The method of processing a wafer according to the first modification is different from the method of processing a wafer according to the first embodiment in that the separation initiating point forming step 1001 and the groove forming step 1002 are switched around in terms of a sequence of execution. Specifically in the method of processing a wafer according to the first modification, the groove forming step 1002 is carried out prior to the separation initiating point forming step 1001.

The groove forming step 1002 according to the first modification is similar to the groove forming step 1002 according to the first embodiment except that the adhesive tape 105 is first affixed to the reverse side 104 of the wafer 100 and grooves, i.e., cut grooves 141 in the first example or laser-processed grooves 151 in the second example, are formed in the wafer 100 in which separation initiating points 135 have not been formed, as illustrated in FIGS. 9 and 10 for the first example or as illustrated in FIG. 11 for the second example.

The separation initiating point forming step 1001 according to the first modification is similar to the separation initiating point forming step 1001 according to the first embodiment except that the adhesive tape 105 affixed to the reverse side 104 of the wafer 100 processed in the groove forming step 1002 is peeled off and affixed to the face side 101 of the wafer 100, and the separation initiating points 135 are formed in the wafer 100 in which grooves, i.e., cut grooves 141 in the first example or laser-processed grooves 151 in the second example, have been formed, as illustrated in FIGS. 12 and 13. FIGS. 12 and 13 illustrate an example in which the separation initiating point forming step 1001 is carried out after the first example of the groove forming step 1002. However, the separation initiating point forming step 1001 may similarly be carried out after the second example of the groove forming step 1002.

A chip peeling step 1003 of the method of processing a wafer according to the first modification is similar to the chip peeling step 1003 according to the first embodiment except that the adhesive tape 105 affixed to the face side 101 of the wafer 100 processed in the separation initiating point forming step 1001 is peeled off and affixed to the reverse side 104 of the wafer 100.

The method of processing a wafer according to the first modification, arranged described above, offers similar advantages to those of the first embodiment because the separation initiating point forming step 1001 and the groove forming step 1002 according to the first embodiment are switched around in terms of a sequence of execution according to the first modification.

Second Embodiment

A method of processing a wafer according to a second embodiment of the present invention will be described below with reference to FIGS. 14 through 19. Those components illustrated in in FIGS. 14 through 19 that are identical to those according to the first embodiment are denoted by identical reference symbols, and will be omitted from description.

The method of processing a wafer according to the second embodiment is different from the method of processing a wafer according to the first embodiment in that chips 160-1 having a thickness 130-1 are produced from a one-half region 170 of a wafer 100 whereas chips 160-2 having a thickness 130-2 are produced from another one-half region 180 of the wafer 100. Other details of the method of processing a wafer according to the second embodiment are the same as those of the method of processing a wafer according to the first embodiment. According to the second embodiment, the thickness 130-1 and the thickness 130-2 are different from each other.

Figure 14:
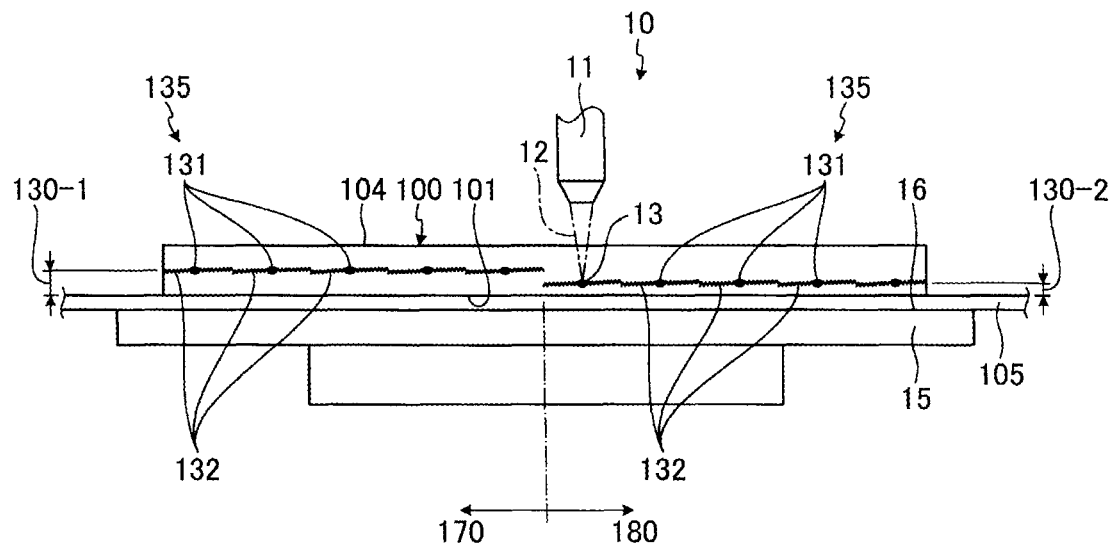
FIG. 14 is a cross-sectional view illustrating a separation initiating point forming step of a method of processing a wafer according to a second embodiment of the present invention.
Figure 15:
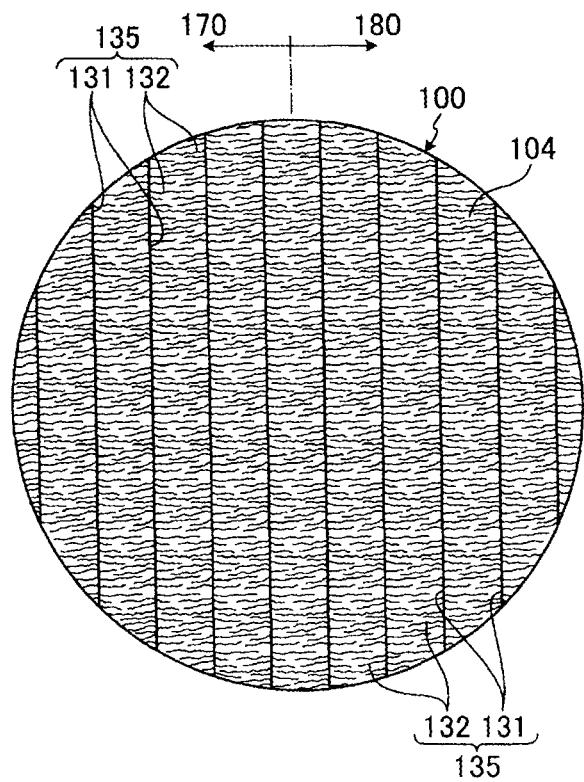
FIG. 15 is a plan view illustrating the separation initiating point forming step of the method of processing a wafer according to the second embodiment.

In a separation initiating point forming step 1001 of the method of processing a wafer according to the second embodiment, the focused spot 13 of the laser beam 12 is positioned at different depths in the respective regions 170 and 180 of the wafer 100, thereby forming separation initiating points 135 at different depths. Other details of the separation initiating point forming step 1001 of the method of processing a wafer according to the second embodiment are the same as those of the separation initiating point forming step 1001 of the method of processing a wafer according to the first embodiment. Specifically, in the separation initiating point forming step 1001 of the method of processing a wafer according to the second embodiment, as illustrated in FIGS. 14 and 15, the focused spot 13 of the laser beam 12 is positioned in the region 170 of the wafer 100 at a depth corresponding to the thickness 130-1 of the chips 160-1 (see FIG. 19) to be produced from the region 170, and the laser beam 12 is applied to the wafer 100 to form modified layers 131 and cracks 132 at the depth, thereby forming separation initiating point 135 in the region 170, and the focused spot 13 of the laser beam 12 is positioned in the region 180 of the wafer 100 at a depth corresponding to the thickness 130-2 of the chips 160-2 (see FIG. 19) to be produced from the region 180, and the laser beam 12 is applied to the wafer 100 to form modified layers 131 and cracks 132 at the depth, thereby forming separation initiating point 135 in the region 180.

Figure 16:
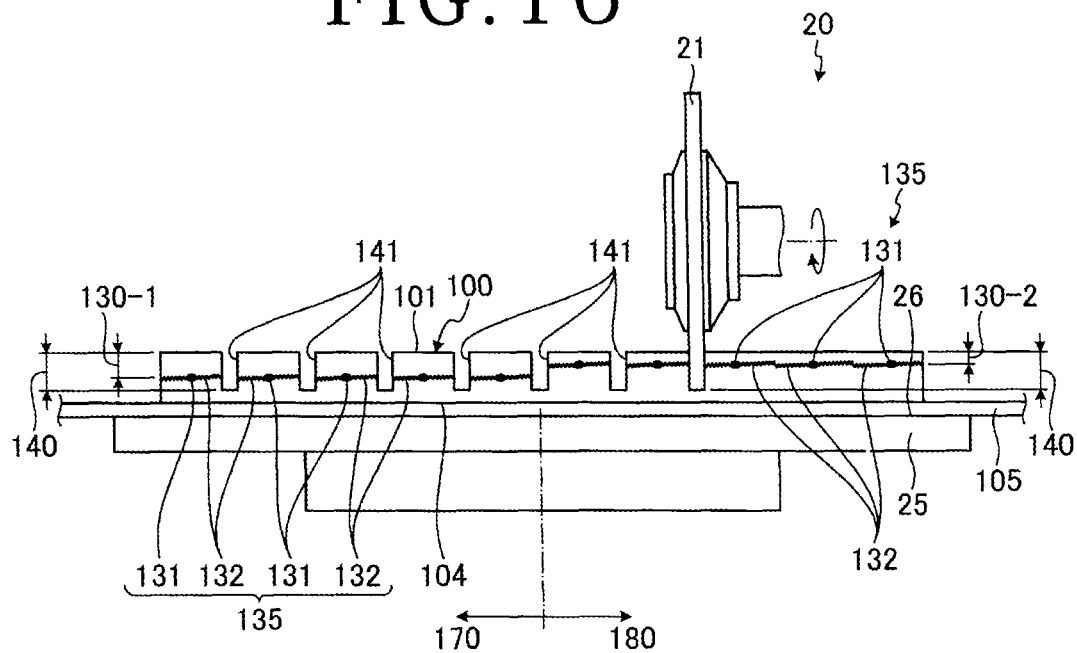
FIG. 16 is a cross-sectional view illustrating a first example of a groove forming step of the method of processing a wafer according to the second embodiment.
Figure 17:
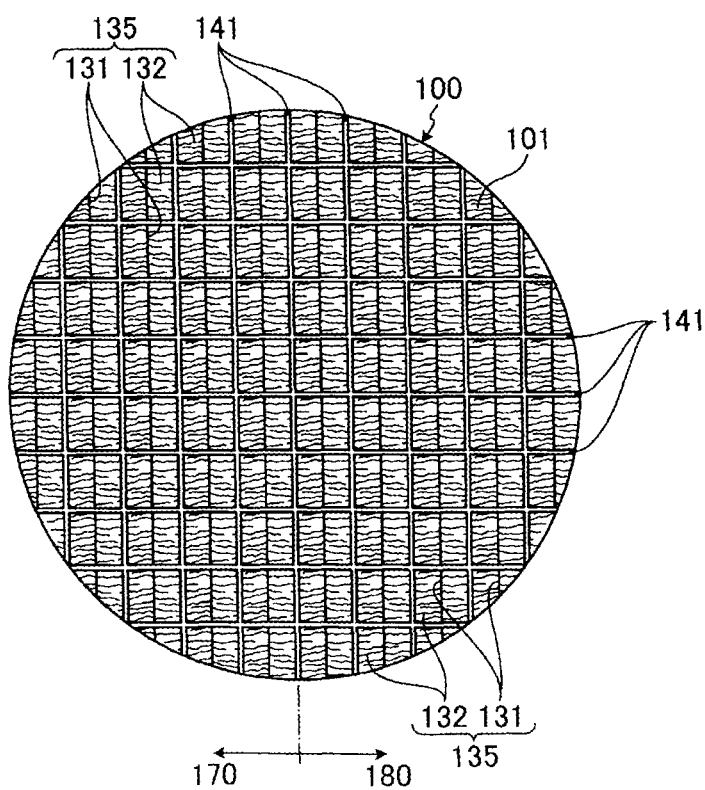
FIG. 17 is a plan view illustrating the first example of the groove forming step of the method of processing a wafer according to the second embodiment.
Figure 18:
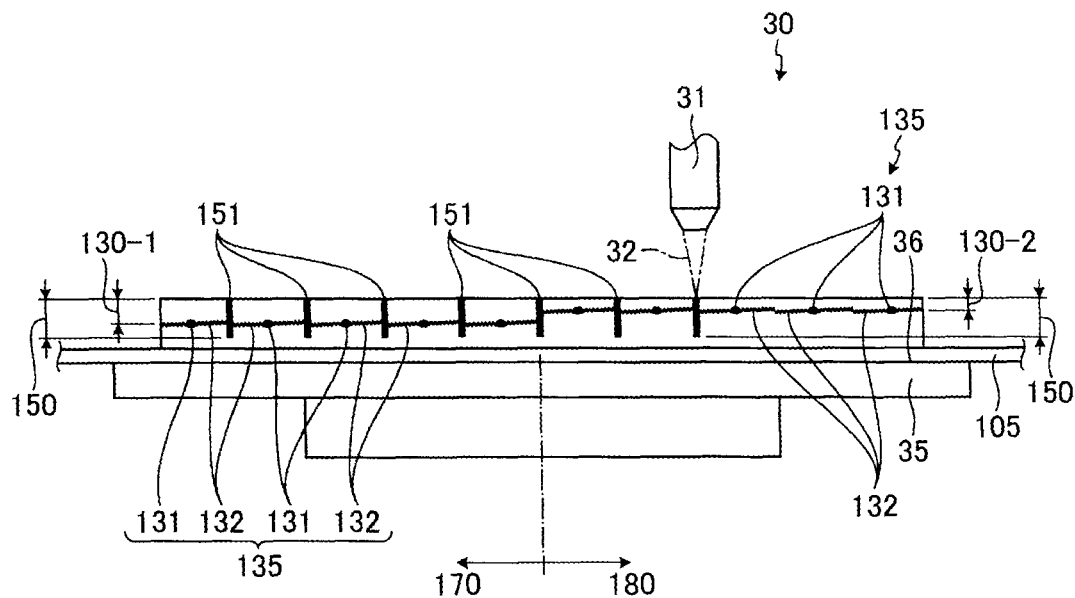
FIG. 18 is a cross-sectional view illustrating a second example of the groove forming step of the method of processing a wafer according to the second embodiment.

In a groove forming step 1002 of the method of processing a wafer according to the second embodiment, as illustrated in FIGS. 16 and 17 for a first example or as illustrated in FIG. 18 for a second example, grooves, i.e., cut grooves 141 according to the first example or laser-processed grooves 151 according to the second example, are formed in the wafer 100 to a depth, i.e., a depth 140 according to the first example or a depth 150 according to the second example, that is equal to or larger than the thickness 130-1 of a thicker one of the chips 160-1 and 160-2 (see FIG. 19) from the face side 101, i.e., the chips 160-1 in the examples illustrated in FIGS. 16 and 18. Other details of the groove forming step 1002 of the method of processing a wafer according to the second embodiment are the same as those of the groove forming step 1002 of the method of processing a wafer according to the first embodiment.

The groove forming step 1002 of the method of processing a wafer according to the second embodiment is not limited to the above details. Grooves surrounding the chip areas 103, i.e., cut grooves 141 according to the first example or laser-processed grooves 151 according to the second example, may be formed in the wafer 100 to a depth, i.e., a depth 140 according to the first example or a depth 150 according to the second example, that is equal to or larger than the thickness, i.e., the thickness 130-1 or 130-2, of the chips to be produced from the chip areas 103, i.e., the chips 160-1 or 160-2. In the groove forming step 1002 of the method of processing a wafer according to the second embodiment, the depth, the depth 140 according to the first example or the depth 150 according to the second example, of the grooves, i.e., the cut grooves 141 according to the first example or the laser-processed grooves 151 according to the second example, may be changed for the respective projected dicing lines 102 depending on the thickness, i.e., the thickness 130-1 or 130-2, of the chips to be produced from adjacent one of the chip areas 103, i.e., the chips 160-1 or 160-2.

Figure 19:
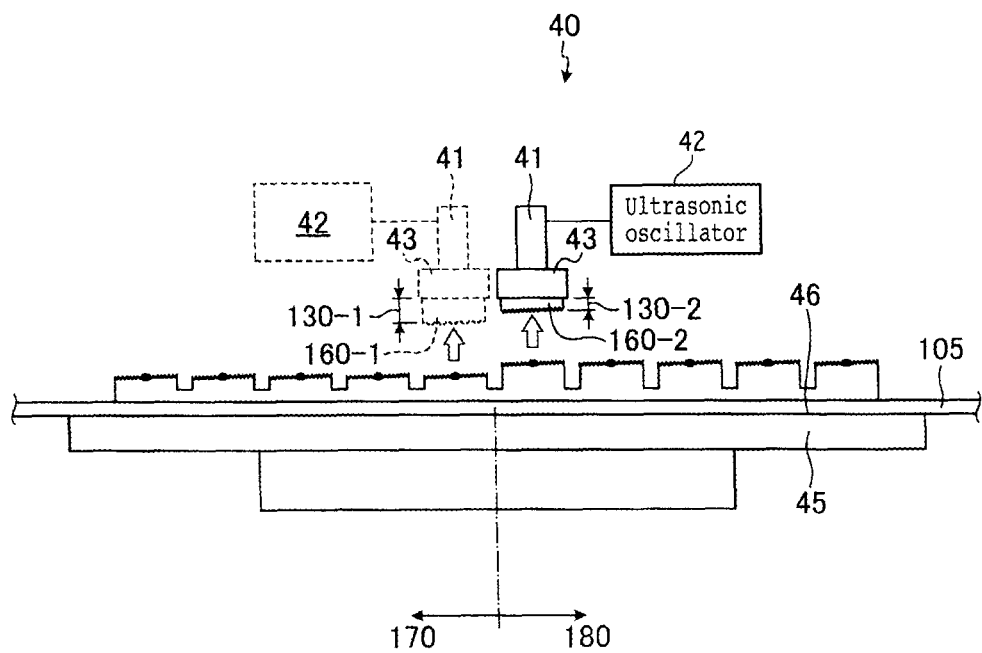
FIG. 19 is a cross-sectional view illustrating a chip peeling step of the method of processing a wafer according to the second embodiment.

A chip peeling step 1003 of the method of processing a wafer according to the second embodiment is different from the chip peeling step 1003 of the method of processing a wafer according to the first embodiment in that, as illustrated in FIG. 19, the chips 160-1 having the thickness 130-1 are peeled off and picked up from the region 170 and the chips 160-2 having the thickness 130-2 are peeled off and picked up from the region 180. Other details of the chip peeling step 1003 of the method of processing a wafer according to the second embodiment are the same as those of the chip peeling step 1003 of the method of processing a wafer according to the first embodiment.

According to the second embodiment, the chips 160-1 and 160-2 having the two different thicknesses 130-1 and 130-2 are produced respectively from the two regions 170 and 180 of the wafer 100. However, the present invention is not limited to such details. Chips having three or more different thicknesses, respectively, may be produced from different regions of wafers, or chips having at least two different thicknesses, respectively, may be produced from the respective chip areas 103 of the wafer 100. In the latter case, in the separation initiating point forming step 1001, the focused spot 13 of the laser beam 12 is positioned at depths depending on the at least two different thicknesses in the respective chip areas 103 of the wafer 100 and the laser beam 12 is applied to the wafer 100 to form separation initiating points 135 therein, and in the groove forming step 1002, grooves surrounding the chip areas 103 are formed in the wafer 100 to depths equal to or larger than the thicknesses of the chips to be produced from the respective chip areas 103.

Heretofore, in a case where chips having different thicknesses are to be produced from one wafer, an inefficient method has additionally been carried out to grind the individual chips to different thicknesses. The method of processing a wafer according to the second embodiment, arranged as described above, is able to produce chips 160-1 and 160-2 having two or more different thicknesses 130-1 and 130-2, i.e., two different thicknesses in FIGS. 14 through 19, from the wafer 100 by forming separation initiating points 135 in the respective chip areas 103 to two or more different depths, i.e., two different depths in FIGS. 14 through 19. Therefore, the method of processing a wafer according to the second embodiment is more efficient than heretofore, and is advantageous in that it can produce chips 160-1 and 160-2 having respective different thicknesses 130-1 and 130-2 from one wafer 100. The method of processing a wafer according to the second embodiment may be modified according to the first modification to switch around the separation initiating point forming step 1001 and the groove forming step 1002 in terms of a sequence of execution.

Third Embodiment

A method of processing a wafer according to a third embodiment of the present invention will be described below with reference to FIGS. 20 through 31. Those components illustrated in in FIGS. 20 through 31 that are identical to those according to the first and second embodiments are denoted by identical reference symbols, and will be omitted from description.

Figure 20:
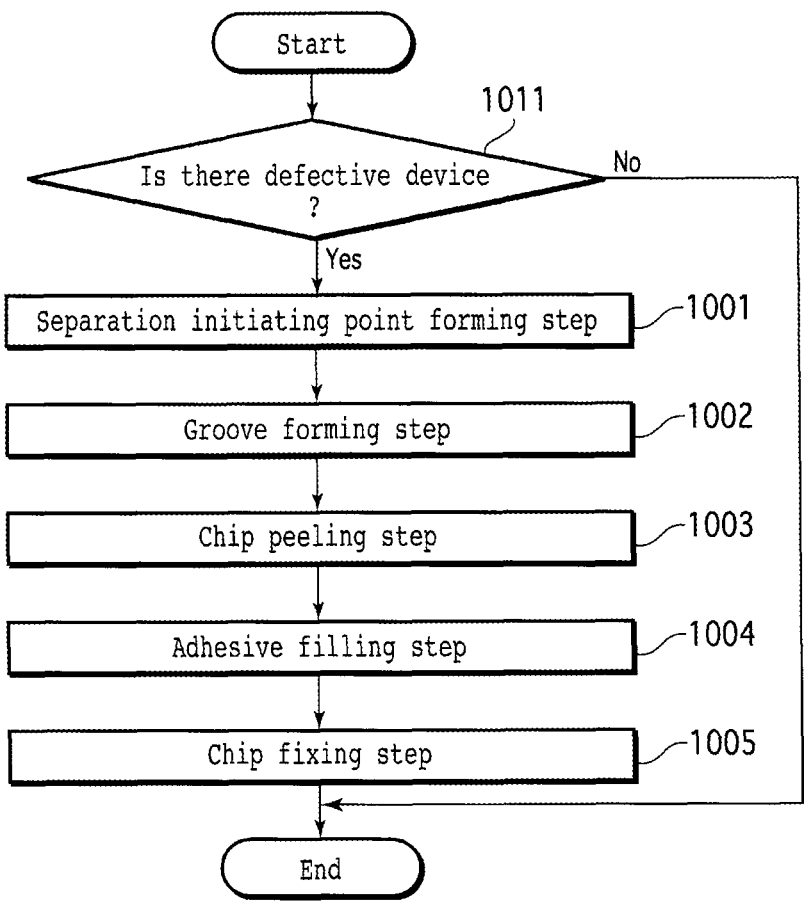
FIG. 20 is a flowchart of an example of a processing sequence of a method of processing a wafer according to a third embodiment of the present invention.

As illustrated in FIG. 20, the method of processing a wafer according to the third embodiment includes a device determining step 1011, a separation initiating point forming step 1001, a groove forming step 1002, a chip peeling step 1003, an adhesive filling step 1004, and a chip fixing step 1005.

The device determining step 1011 is a step that determines whether or not each of chips 160 formed on a wafer 100 is defective. The defective chips 160 are chips whose quality fails to meet the criteria for using them as acceptable products. In the device determining step 1011, a plurality of probes of a device detector or prober, not illustrated, are brought into contact with electrodes on a chip 160, electric signals are supplied from a tester that is electrically connected to the probes to the chip 160, and electric signals returned from the chip 160 are assessed to detect whether or not the chip 160 is defective. However, the present invention is not limited to such details of the device determining step 1011. According to the present invention, any of various known tests may be carried out to determine whether or not the chip 160 is defective.

The processing sequence of the method of processing a wafer according to the third embodiment is ended if it is determined that all the chips 160 are not defective in the device determining step 1011 (No in the device determining step 1011). If it is determined that at least one of the chips 160 is defective in the device determining step 1011 (Yes in the device determining step 1011), then information regarding the position of the defective chip 160 on the wafer 100, the size of the chip area 103 with the defective chip 160 disposed therein, the thickness 130 of the chip area 103, etc. is sent to a control unit that controls the apparatus for carrying out the steps of the method of processing a wafer according to the third embodiment, i.e., the laser processing apparatus 10, the cutting apparatus 20, the laser processing apparatus 30, and the chip peeling apparatus 40, whereupon the control unit proceeds with the processing control to the separation initiating point forming step 1001.

According to the third embodiment, the control unit includes a computer system including an arithmetic processing device having a microprocessor such as a central processing unit (CPU), a storage device having a memory such as a read only memory (ROM) or a random access memory (RAM), and an input/output interface device. The arithmetic processing device performs arithmetic processing sequences according to computer programs stored in the storage device and outputs control signals for controlling the apparatus referred to above through the input/output interface device to the components of the apparatus.

Figure 21:
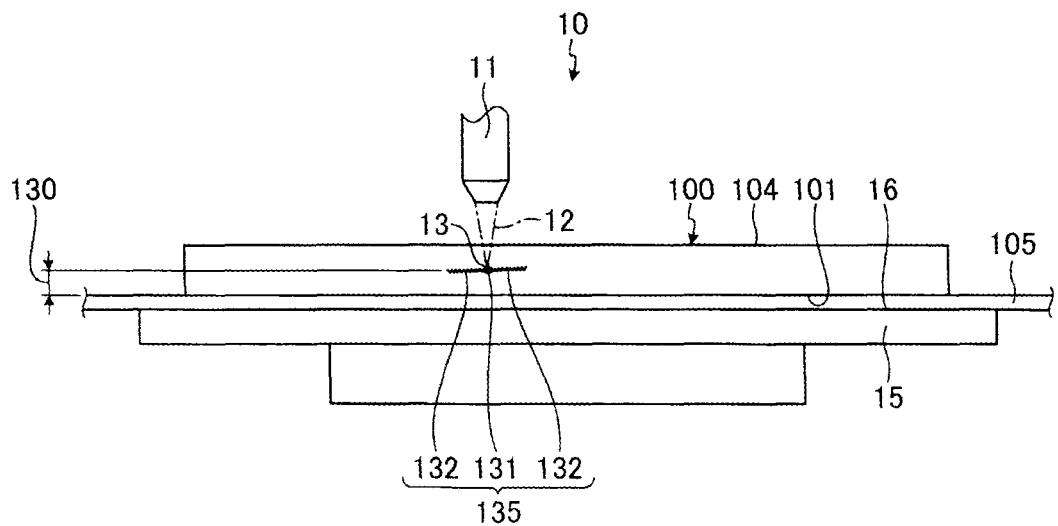
FIG. 21 is a cross-sectional view illustrating a separation initiating point forming step of the method illustrated in FIG. 20.
Figure 22:
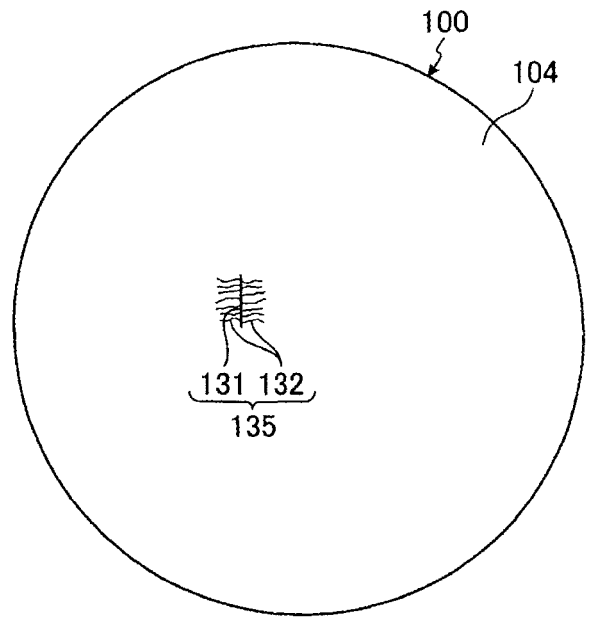
FIG. 22 is a plan view illustrating the separation initiating point forming step of the method illustrated in FIG. 20.

As illustrated in FIGS. 21 and 22, the separation initiating point forming step 1001 of the method of processing a wafer according to the third embodiment is different from the separation initiating point forming step 1001 of the method of processing a wafer according to the first embodiment in that, as illustrated in FIGS. 21 and 22, separation initiating points 135 are formed in the wafer 100 at a depth corresponding to the thickness 130 of a chip 160 that has been determined as defective in the device determining step 1011 only in the chip area 103 that has the chip 160 determined as defective. Other details of the separation initiating point forming step 1001 of the method of processing a wafer according to the third embodiment are the same as those of the separation initiating point forming step 1001 of the method of processing a wafer according to the first embodiment.

Figure 23:
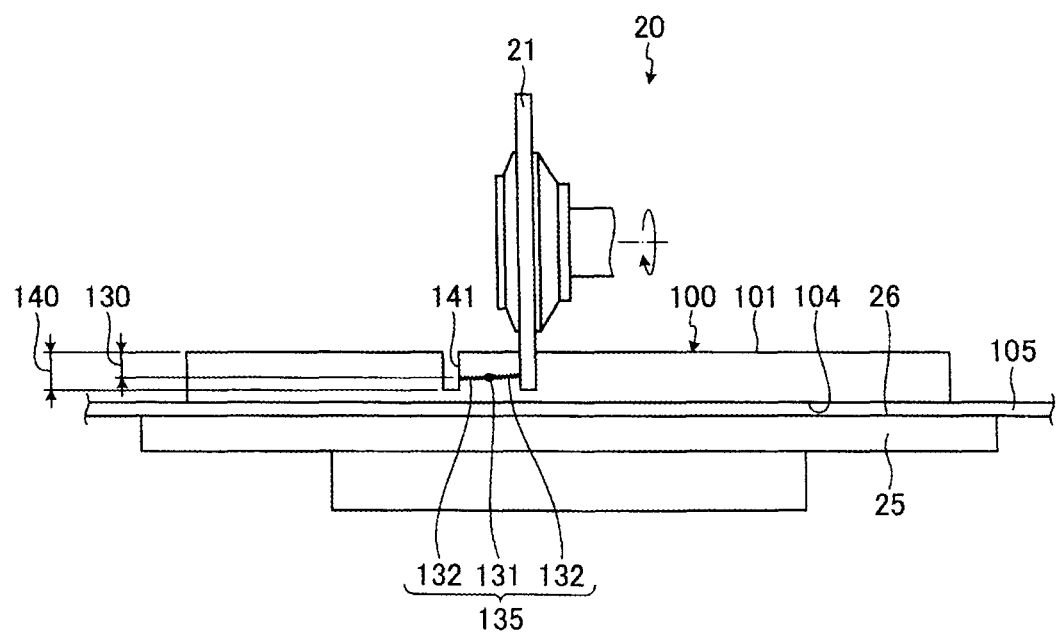
FIG. 23 is a cross-sectional view illustrating a first example of a groove forming step of the method illustrated in FIG. 20.
Figure 24:
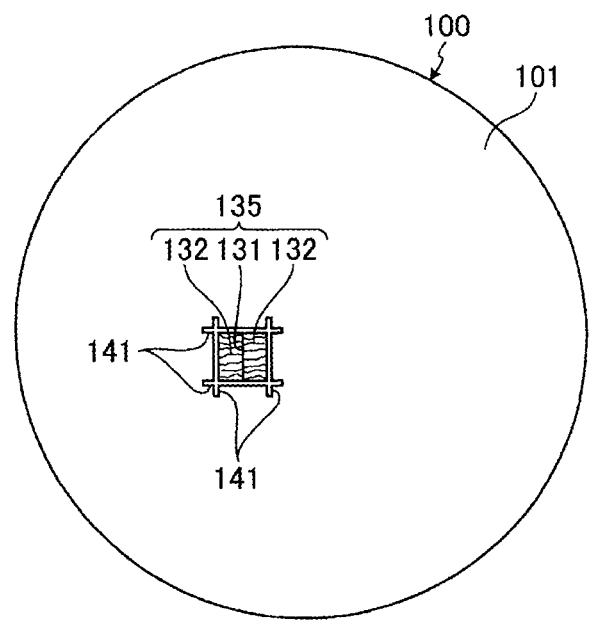
FIG. 24 is a plan view illustrating the first example of the groove forming step of the method illustrated in FIG. 20.
Figure 25:
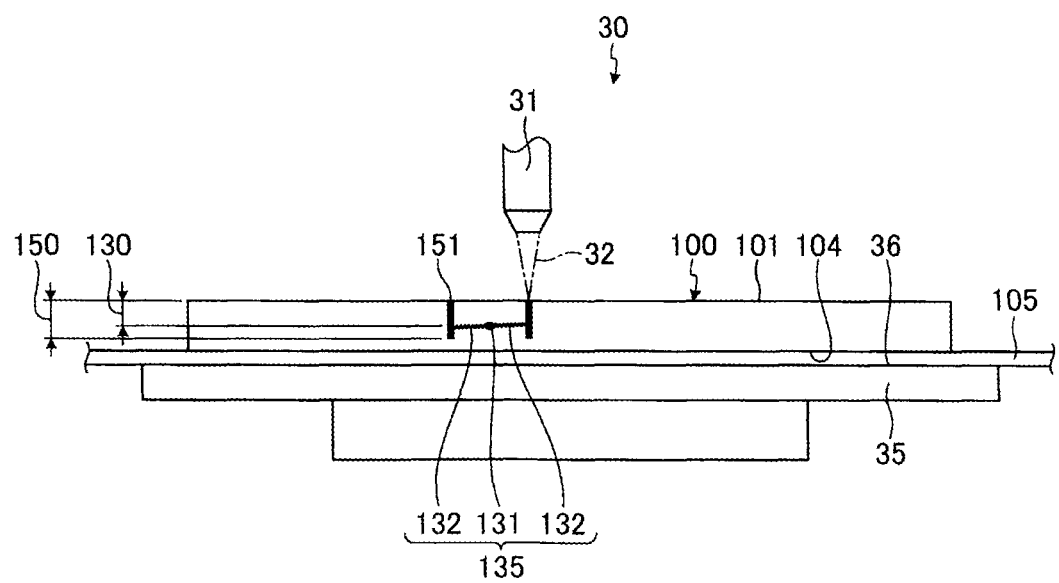
FIG. 25 is a cross-sectional view illustrating a second example of the groove forming step of the method illustrated in FIG. 20.

The groove forming step 1002 of the method of processing a wafer according to the third embodiment is different from the groove forming step 1002 of the method of processing a wafer according to the first embodiment in that, as illustrated in FIGS. 23 and 24 for a first example and as illustrated in FIG. 25 for a second example, grooves, i.e., cut grooves 141 according to the first example or laser-processed grooves 151 according to the second example, are formed in the wafer 100 to a depth, i.e., a depth 140 according to the first example or a depth 150 according to the second example, that is equal to or larger than the thickness 130 of the chip 160 only at portions of the projected dicing lines 102 that surround the chip area 103 having the chip 160 determined as defective in the device determining step 1011. Other details of the groove forming step 1002 of the method of processing a wafer according to the third embodiment are the same as those of the groove forming step 1002 of the method of processing a wafer according to the first embodiment.

In the first example of the groove forming step 1002 of the method of processing a wafer according to the third embodiment, specifically, a chopper cutting process is carried out by positioning the cutting blade 21 above each of the portions of the projected dicing lines 102, lowering the cutting blade 21 as it rotates vertically to a height to cut the wafer 100, thereby forming a cut groove 141 in the wafer 100 to a depth 140, and thereafter lifting the cutting blade 21 vertically upwardly. However, the present invention is not limited to such a chopper cutting process, but cut grooves 141 may be formed in the wafer 100 to a depth 140 along the projected dicing lines 102 surrounding the chip area 103 in the same manner as with the first embodiment.

Figure 26:
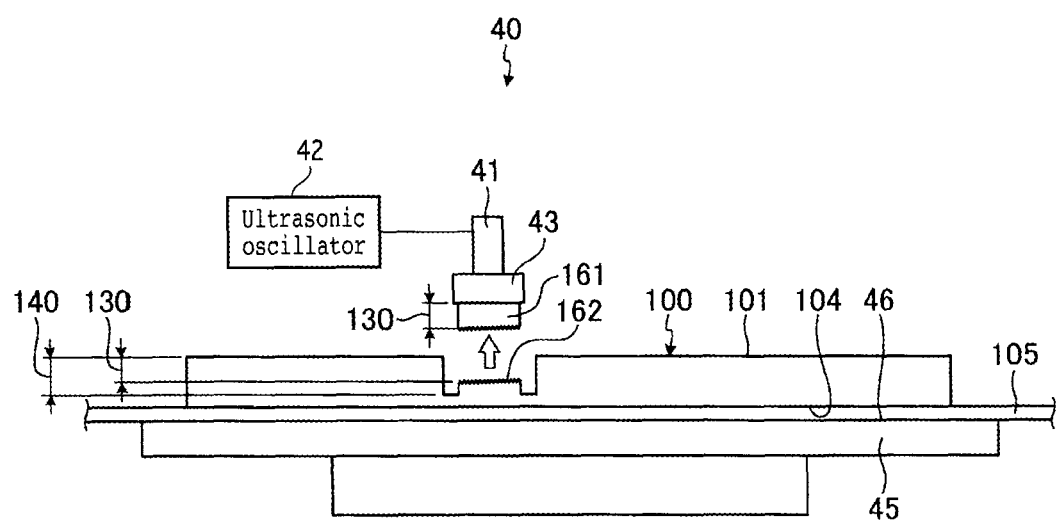
FIG. 26 is a cross-sectional view illustrating a chip peeling step of the method illustrated in FIG. 20.
Figure 27:
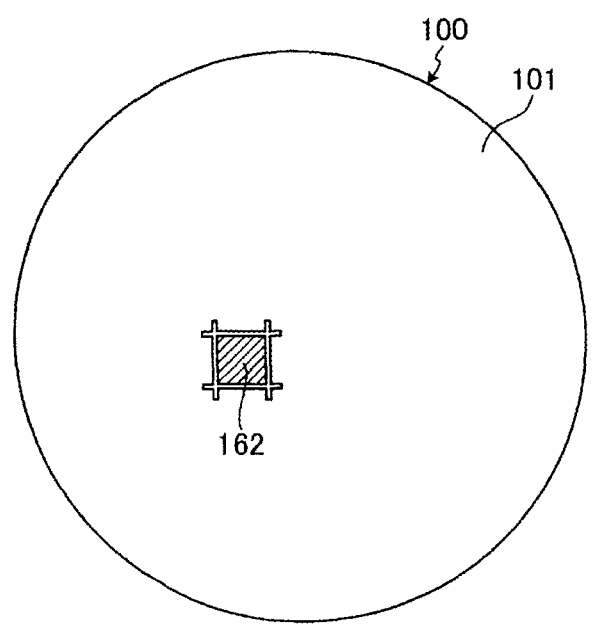
FIG. 27 is a plan view illustrating the chip peeling step of the method illustrated in FIG. 20.

The chip peeling step 1003 of the method of processing a wafer according to the third embodiment is different from the chip peeling step 1003 of the method of processing a wafer according to the first embodiment in that, as illustrated in FIGS. 26 and 27, only the chip 160 that has been determined as defective in the device determining step 1011 is peeled off and picked up. Other details of the chip peeling step 1003 of the method of processing a wafer according to the third embodiment are the same as those of the chip peeling step 1003 of the method of processing a wafer according to the first embodiment. In the chip peeling step 1003 of the method of processing a wafer according to the third embodiment, when the chip 160 that has been determined as defective in the device determining step 1011 is picked up, it leaves a cavity 162 in the wafer 100 to a depth corresponding to the thickness 130 of the chip 160 in a region including the chip area 103 where the chip 160 was present and the portions of the projected dicing lines 102 that surround the chip area 103.

Heretofore, in a case where a chip is to be fully severed and peeled off from the wafer in a thicknesswise direction, another step is required to lower the adhesive power of the adhesive tape only in the chip area having the chip to be peeled off before the chip is peeled off. In the chip peeling step 1003 according to the third embodiment, however, since the chip 160 is peeled off at the separation initiating points 135 formed in the wafer 100, no step is required to lower the adhesive power of the adhesive tape 105 only in the chip area 103 having the chip 160 to be peeled off.

Figure 28:
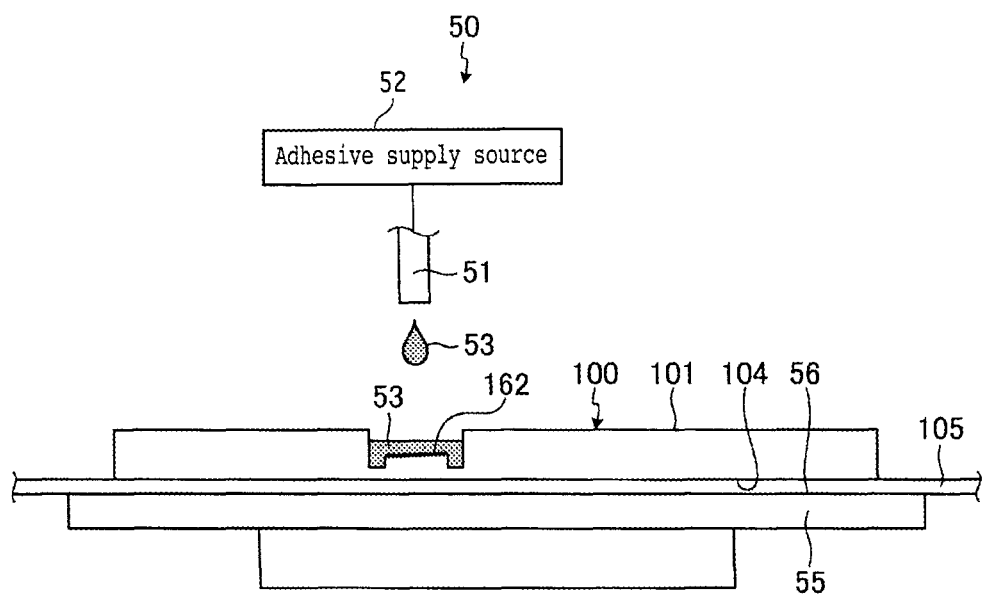
FIG. 28 is a cross-sectional view illustrating an adhesive filling step of the method illustrated in FIG. 20.
Figure 29:
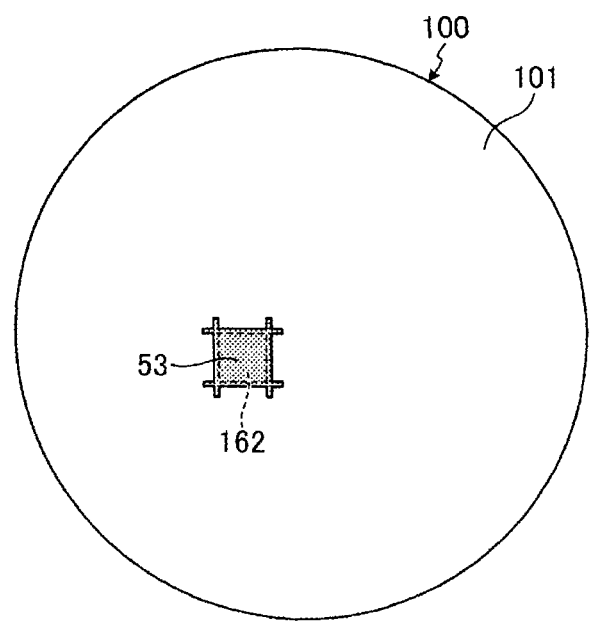
FIG. 29 is a plan view illustrating the adhesive filling step of the method illustrated in FIG. 20.

The adhesive filling step 1004 is a step in which, as illustrated in FIGS. 28 and 29, an adhesive supply source 52 of an adhesive supply apparatus 50 supplies and fills the cavity 162 formed in the wafer 100 in the chip peeling step 1003 with an adhesive 53. According to the third embodiment, the adhesive 53 includes a liquid resin that solidifies in the air to fix a chip 165 (see FIGS. 30 and 31) to be supplied in the chip fixing step 1005. For example, the adhesive 53 should preferably include an adhesive including an organic solvent, a surface-active agent, etc. known in the art.

In the adhesive filling step 1004, as illustrated in FIG. 28, a holding table 55 of the adhesive supply apparatus 50 holds on a holding surface 56 thereof the reverse side 104 of the wafer 100 where the cavity 162 is formed with the adhesive tape 105 interposed therebetween. The holding table 55 is of the same structure as the holding table 15 according to the first embodiment. In the adhesive filling step 1004, next, the adhesive 53 from the adhesive supply source 52 of the adhesive supply apparatus 50 is supplied through a nozzle 51 to the cavity 162 to fill the cavity 162 with the adhesive 53 to a depth just enough to stay within the cavity 162 without overflowing when the chip 165 is placed in the cavity 162 in the chip fixing step 1005.

Figure 30:
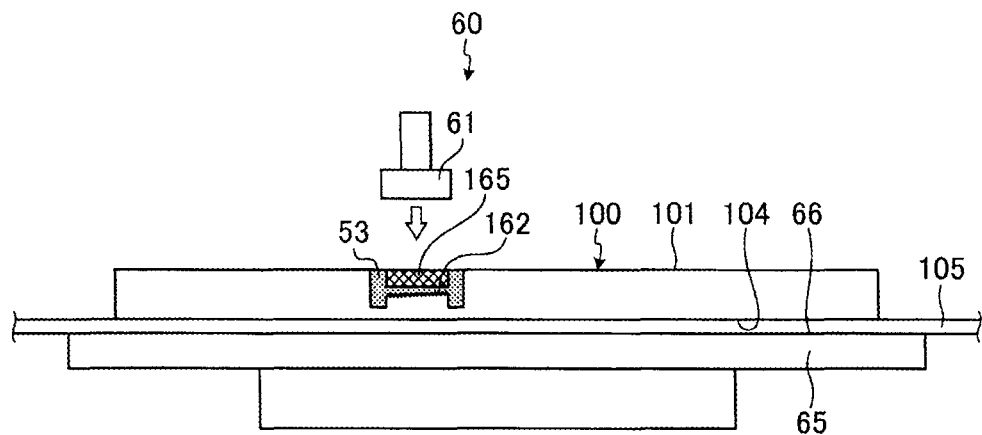
FIG. 30 is a cross-sectional view illustrating a chip fixing step of the method illustrated in FIG. 20.
Figure 31:
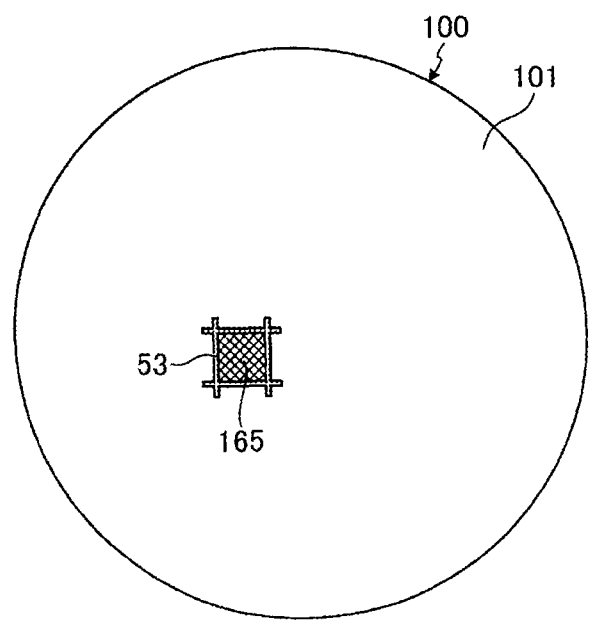
FIG. 31 is a plan view illustrating the chip fixing step of the method illustrated in FIG. 20.

The chip fixing step 1005 is a step in which, as illustrated in FIGS. 30 and 31, a chip fixing apparatus 60 places the chip 165 onto the adhesive 53 that has filled the cavity 162 in the adhesive filling step 1004 and presses the chip 165 against the adhesive 53, thereby fixing the chip 165 to the adhesive 53. According to the third embodiment, the chip 165 is of the same specifications, shape, and size as the chip 160 peeled off from the wafer 100 in the chip peeling step 1003, and can be determined to be defective or non-defective in the same manner as the device determining step 1011.

In the chip fixing step 1005, as illustrated in FIG. 30, a holding table 65 of the chip fixing apparatus 60 holds on a holding surface 66 thereof the reverse side 104 of the wafer 100 where the cavity 162 is filled with the adhesive 53 with the adhesive tape 105 interposed therebetween. The holding table 65 is of the same structure as the holding table 15 according to the first embodiment. In the chip fixing step 1005, next, an attracting suction member 61 of the chip fixing apparatus 60 with the chip 165 held under suction thereon is positioned above the adhesive 53 in the cavity 162, and then presses the chip 165 against the adhesive 53 to a height where the upper surface of the chip 165 lies flush with the face side 101 of the wafer 100. Thereafter, the attracting suction member 61 releases the chip 165.

In the chip fixing step 1005, the height of the upper surface of the chip 165 as measured from the bottom surface of the cavity 162 is equal to the sum of the thickness of the chip 165 and the thickness of the adhesive 53. Consequently, the separation initiating points 135 may be formed in the wafer 100 to a depth larger than the thickness 130 of the chip 160 in the separation initiating point forming step 1001. Further, the chip fixing step 1005 may be followed by a step in which the face side 101 of the wafer 100 is held on the adhesive tape 105 and the reverse side 104 is ground.

In the method of processing a wafer according to the third embodiment, as illustrated in FIGS. 21 through 31, a chip 160 is determined as defective, and the separation initiating point forming step 1001 and succeeding steps are carried out in the chip area 103 where the chip 160 determined as defective exists. However, the present invention is not limited to such details. A plurality of chips 160 may be determined as defective, and the separation initiating point forming step 1001 and succeeding steps may be carried out in each of the chip areas 103 where the chips 160 determined as defective exist.

Heretofore, according to a stacking process known as Wafer On Wafer or WOW, a plurality of wafers of semiconductor devices are stacked together and interconnected by through electrodes extending through the stacked wafers, after which the stacked wafers are divided into stacked chips. If one of the wafers in the stack contains a defective chip, then the chip on the upper wafer stacked over the defective chip also goes out of use. In the method of processing a wafer according to the third embodiment, however, a chip or a device 160 that is determined as defective can selectively be removed, and a chip or a device 160 that is determined as good can be embedded as a chip 165 in the chip area 103 from which the defective chip 160 has been removed. In this manner, the chips 160 in all the chip areas 103 of the wafer 100 are determined as good. Therefore, the method of processing a wafer according to the third embodiment is advantageous in that it prevents stacked wafers produced by the WOW process from having useless chips. The method of processing a wafer according to the third embodiment may be modified according to the first modification to switch around the separation initiating point forming step 1001 and the groove forming step 1002 in terms of a sequence of execution.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a wafer to produce chips therefrom, the wafer having on a face side thereof a plurality of projected dicing lines classified into two groups extending respectively in first directions and second directions transverse to the first directions and a plurality of chip areas demarcated by the projected dicing lines, wherein devices are formed respectively in the chip areas, the method comprising:
   a groove forming step of forming grooves in the wafer to a depth equal to or larger than a desired thickness of the chips from the face side of the wafer along the projected dicing lines;
   a separation initiating point forming step of positioning a focused spot of a laser beam having a wavelength transmittable through the wafer, at a depth in the wafer corresponding to a thickness of the chips from a reverse side of the wafer that is opposite the face side thereof, applying the laser beam to the wafer, with the devices thereon, while moving the focused spot and the wafer relatively to each other, thereby forming separation initiating points in the wafer that are parallel to the face side of the wafer and made up of modified layers and cracks extending from the modified layers in the wafer that define a separation layer; and
   a chip peeling step of peeling off the chips from the wafer at the separation initiating points, wherein the separation layer forms a bottom surface of each of the chips peeled off during the chip peeling step.

2. The method of processing a wafer according to claim 1,
   wherein the groove forming step, the separation initiating point forming step, and the chip peeling step are carried out in any one of the chip areas in which the device is determined as defective.

3. The method of processing according to claim 1, wherein the groove forming step is performed before the separation initiating point forming step.

4. The method of processing according to claim 1, wherein the groove forming step is performed after the separation initiating point forming step.

5. The method of processing according to claim 1, wherein the groove forming step is performed with a laser.

6. The method of processing according to claim 1, wherein the groove forming step is performed with a cutting blade.

7. The method of processing a wafer according to claim 1,
   wherein the groove forming step, the separation initiating point forming step, and the chip peeling step are only carried out in any one of the chip areas in which the device is determined as defective.

8. The method of processing a wafer according to claim 7, further comprising:
   an adhesive filling step of filling, with an adhesive, a cavity formed within the wafer where a defective device has been peeled from the wafer during the chip peeling step.

9. The method of processing a wafer according to claim 1, the method further comprising:
   a device determining step in which a determination is made as to whether any of the devices are defective, and
   wherein the groove forming step, the separation initiating point forming step, and the chip peeling step are carried out in any one of the chip areas in which the device has been determined to be defective during the device determining step.

10. The method of processing a wafer according to claim 9, wherein:
   the device determining step is performed before the groove forming step.

11. The method of processing a wafer according to claim 9, wherein:
   the device determining step is performed before the separation initiating point forming step.

12. The method of processing a wafer according to claim 9, wherein:
   the device determining step is performed before both the separation initiating point forming step and the groove forming step.

13. The method of processing a wafer according to claim 9, wherein:
   the device determining step is performed before the separation initiating point forming step; and
   the separation initiating point forming step is performed before the groove forming step.

14. The method of processing a wafer according to claim 9, further comprising:
   an adhesive filling step of filling, with an adhesive, a cavity formed within the wafer where a defective device has been peeled from the wafer during the chip peeling step.

15. A method of processing a wafer to produce chips therefrom, the wafer having on a face side thereof a plurality of projected dicing lines classified into two groups extending respectively in first directions and second directions transverse to the first directions and a plurality of chip areas demarcated by the projected dicing lines, comprising:
   a groove forming step of forming grooves in the wafer to a depth equal to or larger than a desired thickness of the chips from the face side of the wafer along the projected dicing lines;
   a separation initiating point forming step of positioning a focused spot of a laser beam having a wavelength transmittable through the wafer, at a depth in the wafer corresponding to a thickness of the chips from a reverse side of the wafer that is opposite the face side thereof, applying the laser beam to the wafer while moving the focused spot and the wafer relatively to each other, thereby forming separation initiating points in the wafer that are parallel to the face side of the wafer and made up of modified layers and cracks extending from the modified layers in the wafer; and
   a chip peeling step of peeling off the chips from the wafer at the separation initiating points,
   wherein:
      the separation initiating point forming step includes applying the laser beam to the wafer while positioning the focused spot thereof at depths depending on at least two different thicknesses of chips respectively in the chip areas,
      the groove forming step includes forming grooves in the wafer to a depth equal to or larger than the desired thickness of the chips respectively in the chip areas, and
      the chip peeling step includes forming chips having at least two different thicknesses respectively in the chip areas.

16. A method of processing a wafer to produce chips therefrom, the wafer having on a face side thereof a plurality of projected dicing lines classified into two groups extending respectively in first directions and second directions transverse to the first directions and a plurality of chip areas demarcated by the projected dicing lines, the method comprising:

a groove forming step of forming grooves in the wafer to a depth equal to or larger than a desired thickness of the chips from the face side of the wafer along the projected dicing lines;

a separation initiating point forming step of positioning a focused spot of a laser beam having a wavelength transmittable through the wafer, at a depth in the wafer corresponding to a predetermined thickness of the chips from a reverse side of the wafer that is opposite the face side thereof, applying the laser beam to the wafer while moving the focused spot and the wafer relatively to each other, thereby forming separation initiating points in the wafer that are parallel to the face side of the wafer and made up of modified layers and cracks extending from the modified layers in the wafer; and a chip peeling step of peeling off the chips from the wafer at the separation initiating points, wherein the chips peeled off during the peeling step are of the predetermined thickness without using a grinding apparatus.

17. The method of processing according to claim 16, wherein the groove forming step is performed before the separation initiating point forming step.

18. The method of processing according to claim 16, wherein the groove forming step is performed after the separation initiating point forming step.

19. The method of processing according to claim 16, wherein the groove forming step is performed with a laser.

20. The method of processing according to claim 16, wherein the groove forming step is performed with a cutting blade.

* * * * *